(12) United States Patent
Tsukada

(10) Patent No.: US 7,310,238 B2
(45) Date of Patent: Dec. 18, 2007

(54) THIN-FILM EMBEDDED CAPACITANCE, METHOD FOR MANUFACTURING THEREOF, AND A PRINTED WIRING BOARD

(75) Inventor: Kiyotaka Tsukada, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 11/498,070

(22) Filed: Aug. 3, 2006

(65) Prior Publication Data

US 2007/0030627 A1 Feb. 8, 2007

(30) Foreign Application Priority Data

Aug. 5, 2005 (JP) .............................. 2005-227798

(51) Int. Cl.
*H05K 1/18* (2006.01)
(52) U.S. Cl. .................. 361/761; 361/306.1; 361/311; 257/295; 257/306; 257/675; 438/240; 438/305; 438/393; 438/396; 438/584
(58) Field of Classification Search ............. 361/306.1, 361/311, 761; 257/295, 306, 675; 438/240, 438/305, 393, 396, 584
See application file for complete search history.

(56) References Cited

U.S. PATENT DOCUMENTS

| | | | |
|---|---|---|---|
| 3,553,087 A * | 1/1971 | Muramatsu ................. 205/200 |
| 3,684,543 A * | 8/1972 | Meyer et al. ................ 428/472 |
| 5,527,729 A * | 6/1996 | Matsumoto et al. ......... 438/396 |
| 5,986,301 A * | 11/1999 | Fukushima et al. ......... 257/306 |
| 6,207,522 B1 * | 3/2001 | Hunt et al. .................. 438/393 |
| 6,266,227 B1 * | 7/2001 | Konushi et al. ........... 361/306.1 |
| 6,282,356 B1 * | 8/2001 | Johnston et al. ............ 385/129 |
| 6,596,599 B1 * | 7/2003 | Guo ............................ 438/305 |
| 6,781,176 B2 * | 8/2004 | Ramesh ....................... 257/295 |
| 2002/0102791 A1 * | 8/2002 | Kurasawa et al. .......... 438/240 |
| 2003/0146499 A1 * | 8/2003 | Kondo et al. ................ 257/675 |
| 2004/0264103 A1 * | 12/2004 | Otsuka et al. ........... 361/306.1 |
| 2006/0292841 A1 * | 12/2006 | Quick ......................... 438/584 |

FOREIGN PATENT DOCUMENTS

JP 6-252346 9/1994
JP 2001-15918 1/2001

* cited by examiner

*Primary Examiner*—Dean A. Reichard
*Assistant Examiner*—Xiaoliang Chen
(74) *Attorney, Agent, or Firm*—Oblon, Spivak, McClelland, Maier & Neustadt, P.C.

(57) ABSTRACT

The present invention provides a thin-film embedded capacitance having a substantial electrostatic capacity per unit area, and a method for manufacturing thereof.

A thin film embedded capacitance comprising: a metallic thin-film for wiring made of a metallic material in a non-yield state; the first electrode formed on the film for wiring; a dielectric material layer formed on the first electrode and the film for wiring, at a temperature not lower than ordinary room temperature to lower than a yield temperature of the film for wiring, having a coefficient of thermal expansion lower than that the film for wiring; and the second electrode formed on the dielectric material layer, and a method for manufacturing thereof.

19 Claims, 11 Drawing Sheets

Fig. 2
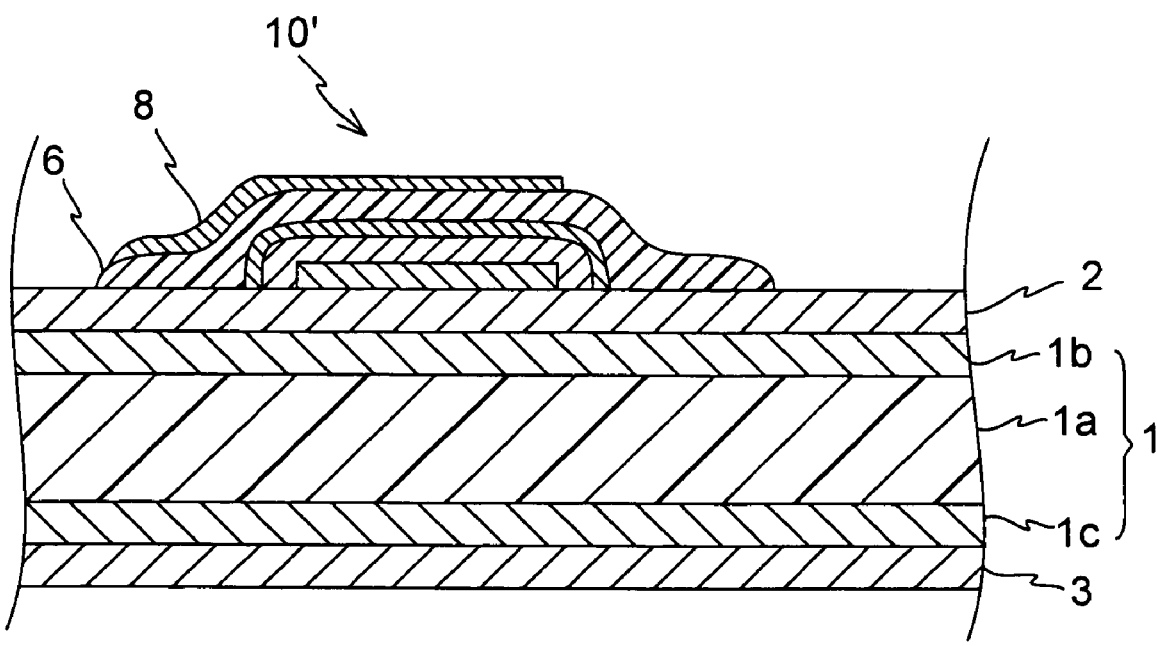
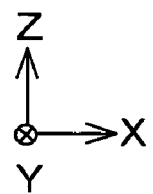

Fig. 3A
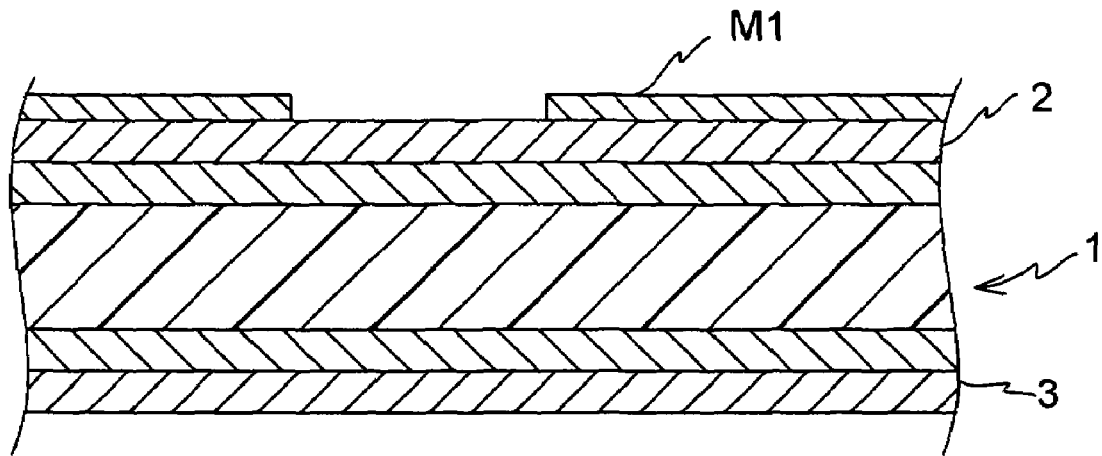
Fig. 3B
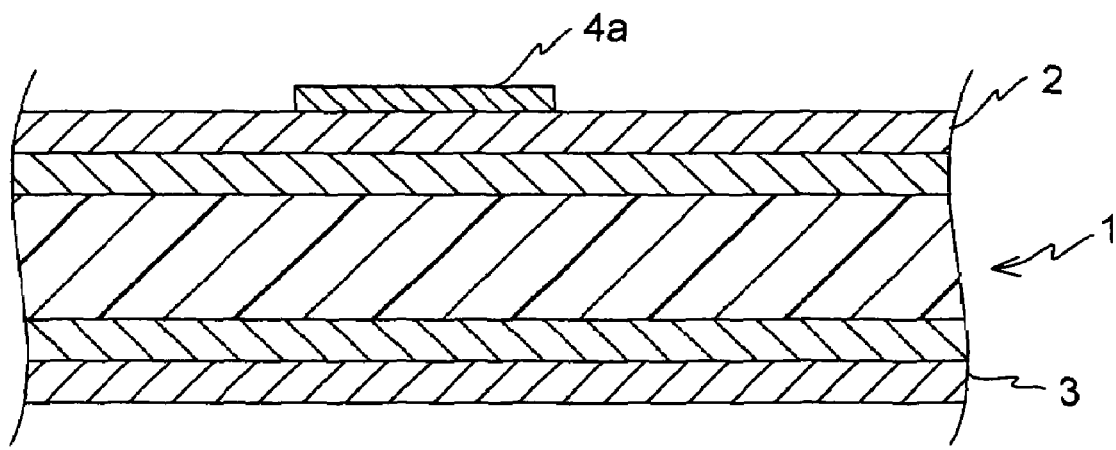
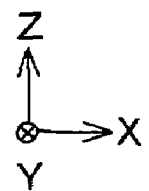

Fig. 4A
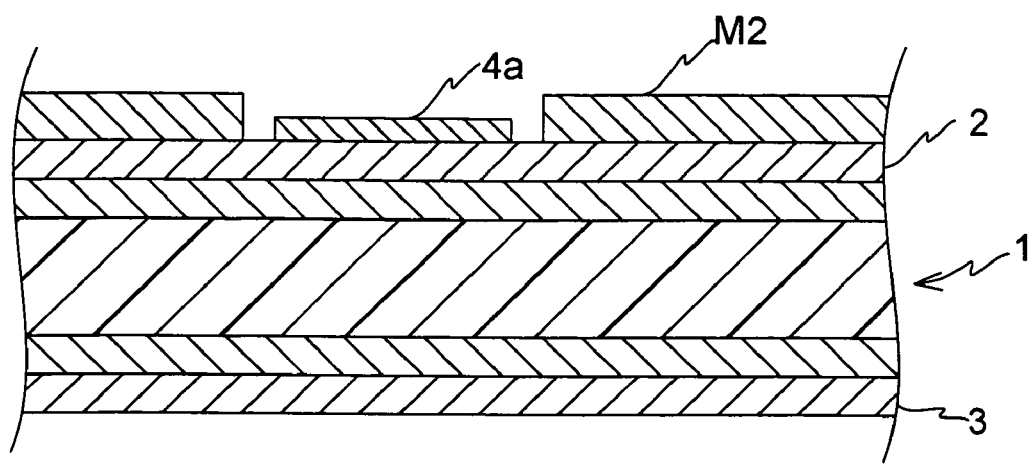
Fig. 4B
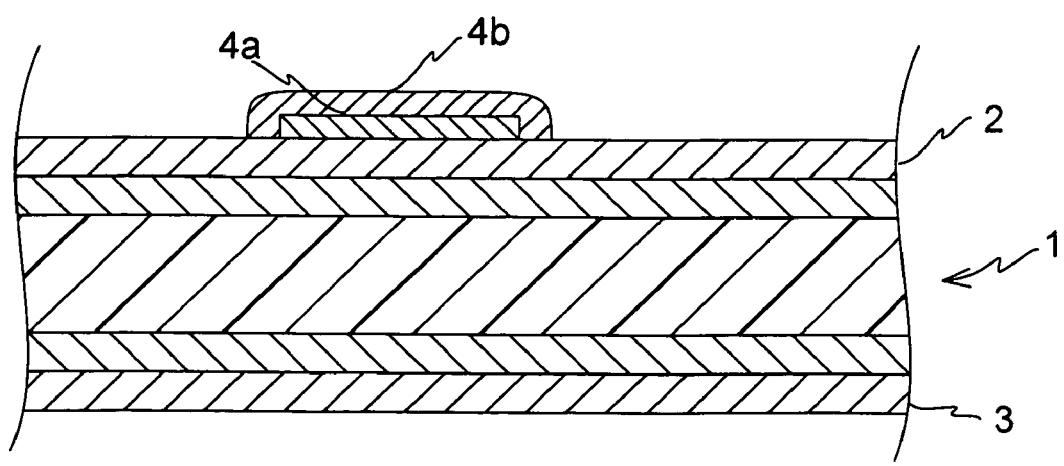
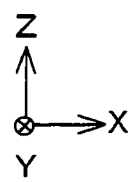

Fig. 5A
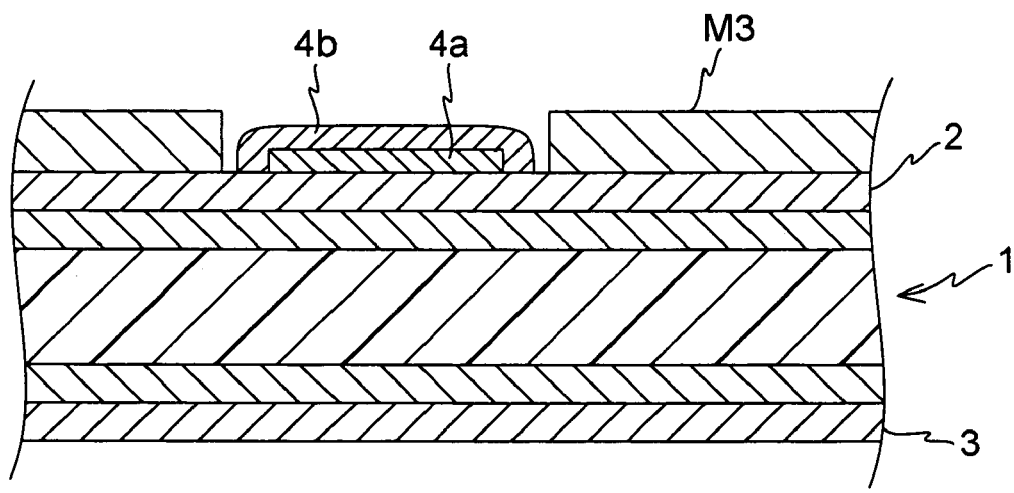
Fig. 5B
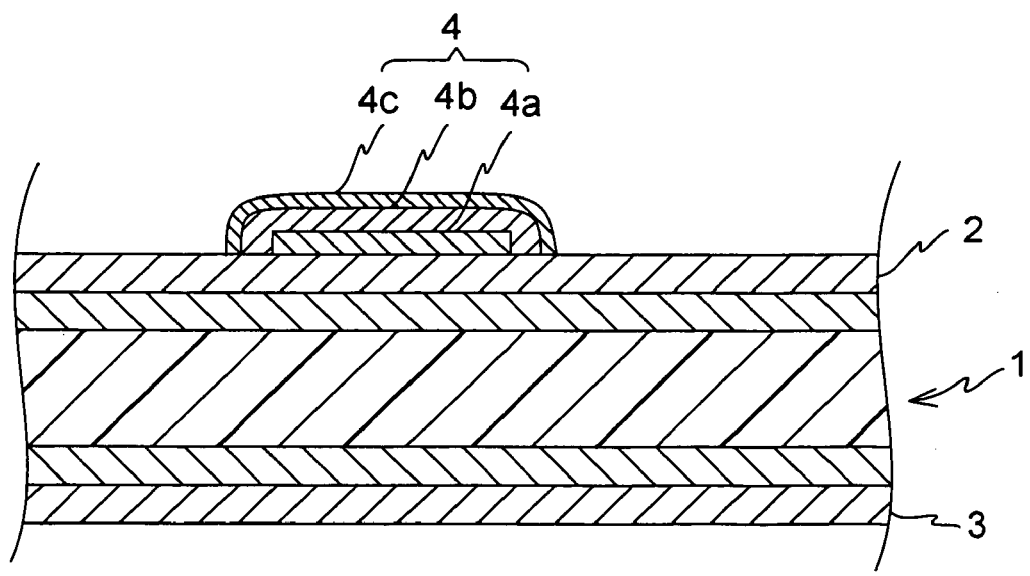
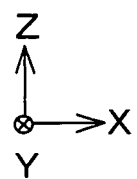

Fig. 6A
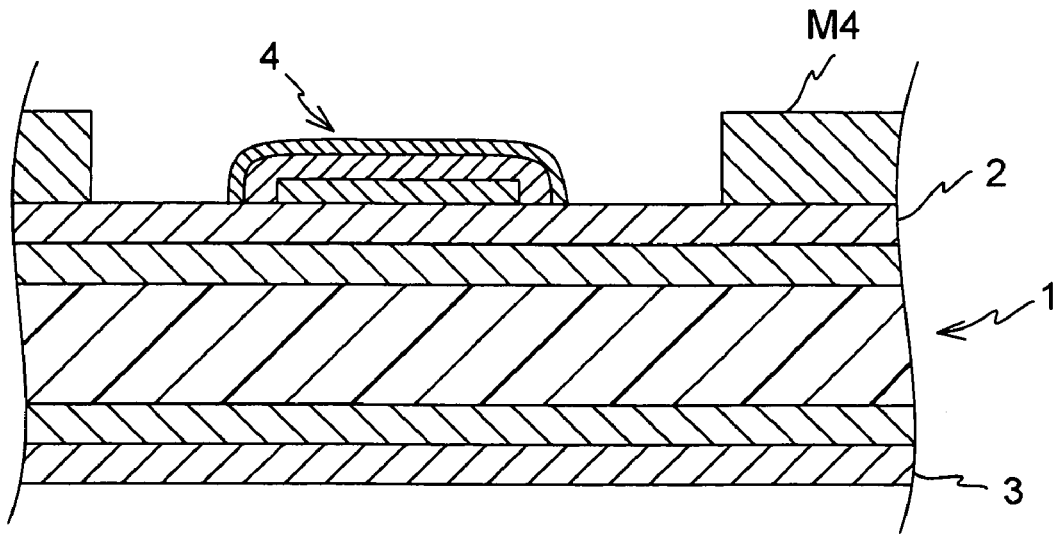
Fig. 6B
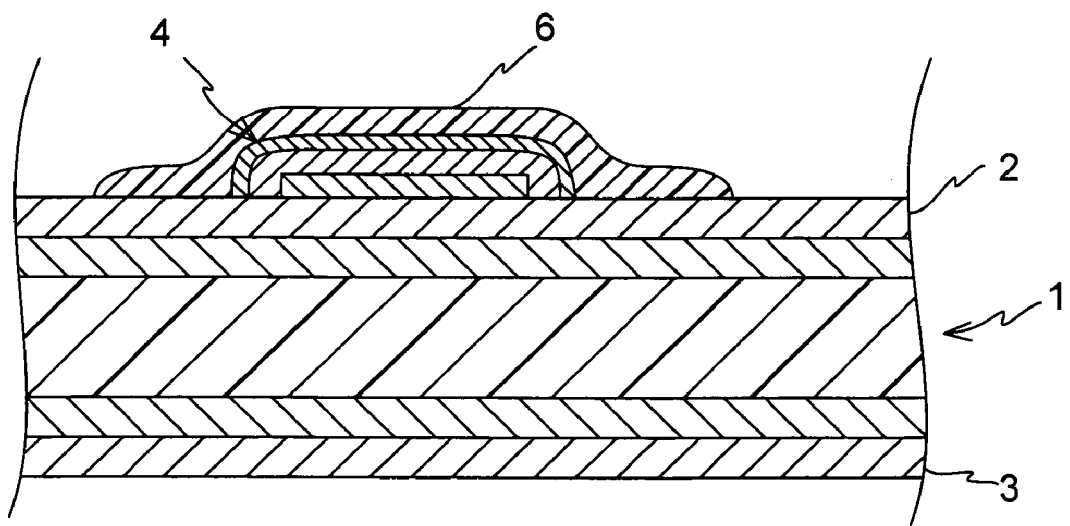
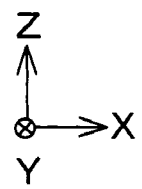

Fig. 7A
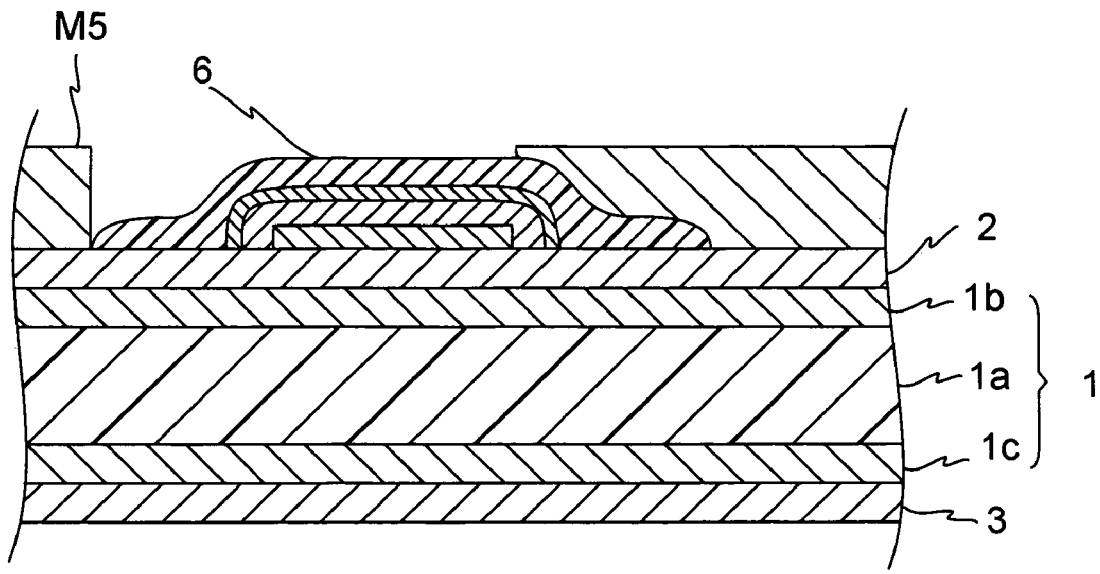
Fig. 7B
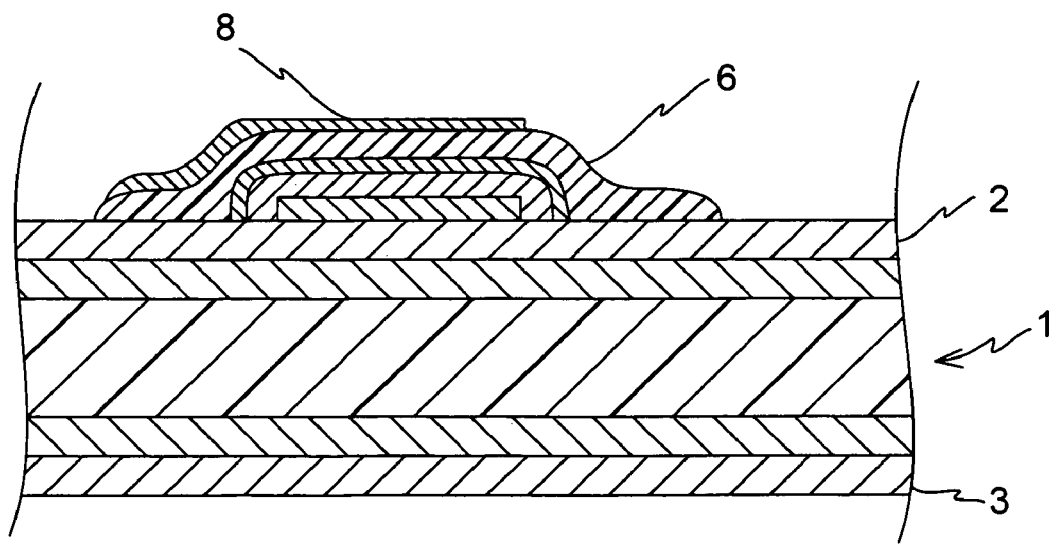
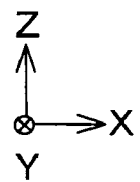

Fig. 8A
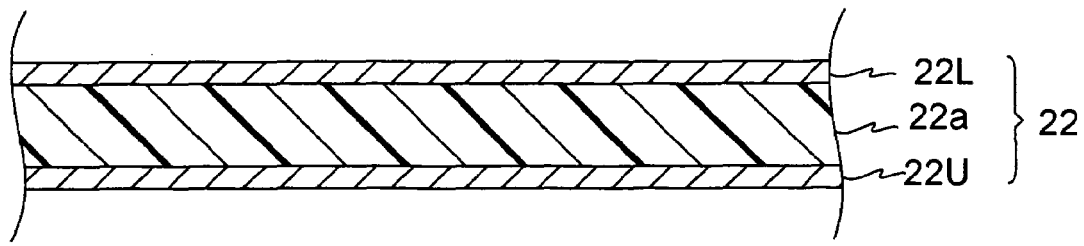
Fig. 8B
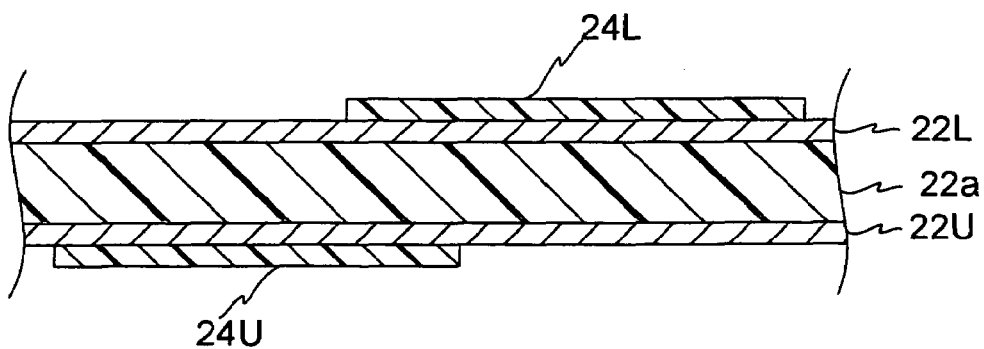
Fig. 8C
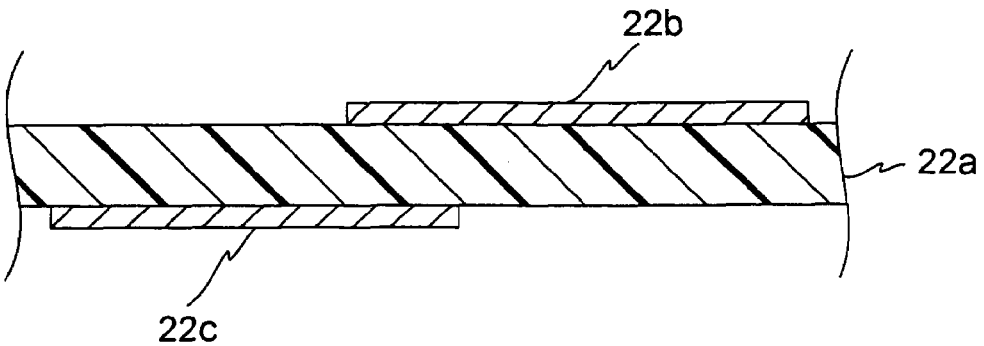
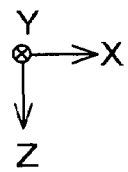

Fig.9A
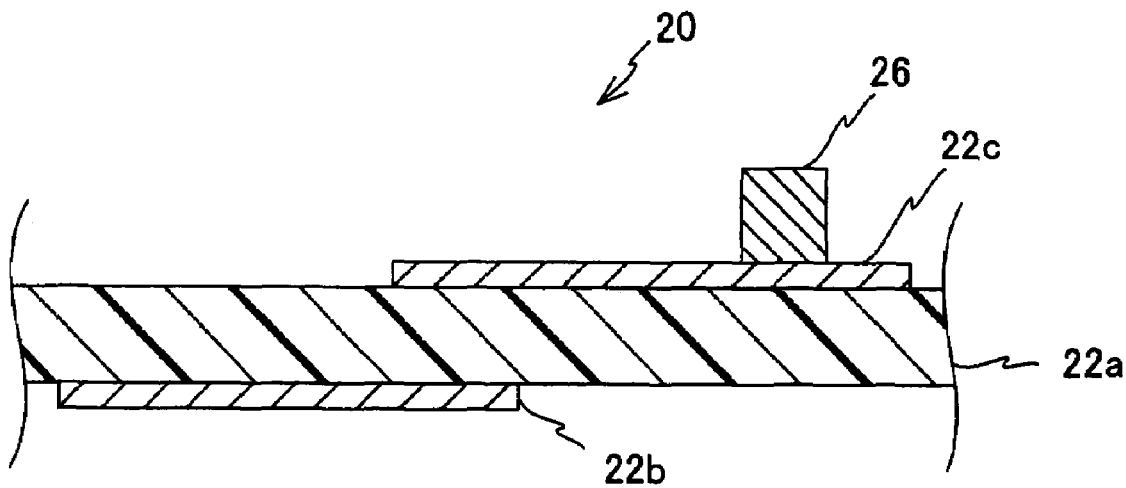
Fig.9B
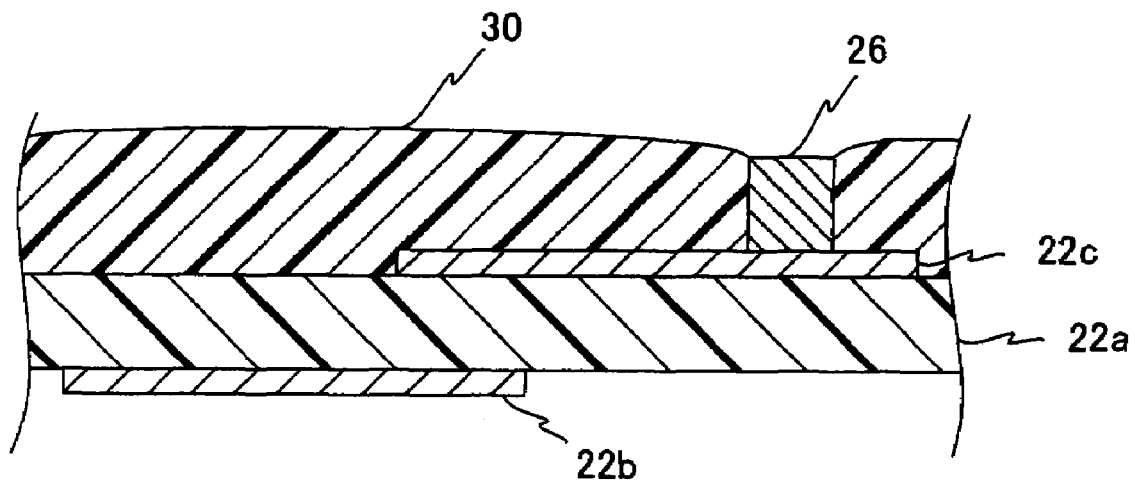
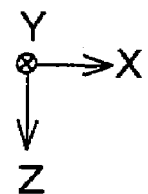

THIN-FILM EMBEDDED CAPACITANCE, METHOD FOR MANUFACTURING THEREOF, AND A PRINTED WIRING BOARD

RELATED APPLICATION

The present application claims priority from Japanese Patent Application No. 2005-227798, filed on Aug. 5, 2005, the disclosure of which are incorporated herein by reference in its entirety.

TECHNICAL FIELD

The present invention relates to a thin-film embedded capacitance, a method for manufacturing thereof, and a printed wiring board which includes the thin-film embedded capacitance.

DESCRIPTION OF THE RELATED ART

In recent years, a signal processing has been performed at a high speed. Moreover, since a wiring density has been increasing to be higher and higher, it is necessary to consider a capacitance which is a passive circuit element built into a printed wiring board.

Under such backgrounds, a printed wiring board which is formed of a highly dielectric material made of a perovskite compound of which, barium titanate is a typical example, or a mixture of this highly dielectric material with an organic material such as an epoxy, a polyphenylene ether (PPE) and a polyimide, has been proposed in Japanese Patent Application Laid-open Publication No. 2001-15918. As mentioned above, the printed wiring board formed of a mixture with the organic material is a superior art, because a dielectric layer including a highly dielectric material is formed in a resin insulating layer between an internal layer conductor circuit and an external layer conductor circuit in a build-up wiring layers, thereby imparting a condenser function in a wiring layer.

Moreover, a method for manufacturing a capacitance for a semiconductor has been proposed in Japanese Patent Application Laid-open Publication No. H06-252346. The disclosed art is not related to embed a capacitance in the printed wiring board, but it is related to the method for manufacturing the capacitance for the semiconductor that comprising steps of: heating a semiconductor substrate up to a temperature of 200° C. or higher to form a film of strontium titanate, and cooling down the semiconductor substrate at a speed of 150° C./min or more. This method is superior art, because an insulating film of strontium titanate without inferiority at a comparatively low temperature than forming the film at a high temperature can be formed.

SUMMARY OF THE INVENTION

A thin-film embedded capacitance of the present invention comprises: the first electrode which is formed on a metallic thin film for wiring made of a metallic material in the non-yield state; in which a dielectric material layer formed on the first electrode and the metallic thin film for wiring, at a temperature not lower than an ordinary room temperature and lower than a yield temperature of the metallic thin film for wiring, having a coefficient of thermal expansion lower than that of the metallic thin film for wiring; and the second electrode formed on the dielectric material layer.

Herein, yield is defined as a phenomenon in which regarding a tension, a compression, and a bending of a material, a linear relationship between a stress and a distortion is ripped apart, and even when the stress is not increased but distortion is increased, that is, a perfect plastic deformation. When a certain object assumes a yield state, a change in a crystalline structure causes the change of physical properties of the object, and a plastic distortion is left in the object, and there is an increase in fragility.

When the metallic material is used as the thin film for wiring, in the non-yield state, there is no change in the physical properties, and it is possible to use it as a capacitance. However, when it becomes the yield state, the crystalline structure turns into a non-crystalline amorphous structure. Since the amorphous structure tends to become the crystalline structure at a high temperature, it sometimes becomes unstable thermodynamically.

For the reasons mentioned above, the metallic film for wiring made of a metallic material mainly in a non-yield state, is used.

Moreover, it is preferable to use copper as the metallic material in the non-yield state, because copper is suitable for embedding the capacitance. Herein, it is preferable that a specific surface area of copper used as the thin film for wiring is not less than approximately 1.3. This is because, when the specific surface area is not less than approximately 1.3, it is possible to secure the same or improved adhesion strength of the capacitance, compared to the adhesion strength so far.

Each of the first electrode, the dielectric material layer, and the second electrode is formed on the metallic thin film for wiring, by a material and a method which will be described later.

In the thin-film embedded capacitance of the present invention, the first electrode may comprise a titanium layer formed on the metallic thin layer for wiring, a barrier layer formed so as to cover the titanium layer, and a nickelate compound layer formed so as to cover the barrier layer.

Herein, from points of view of corrosion resistance, and electrostatic property, it is preferable that the barrier layer is a thin film formed of a metal selected from a group consisting of ruthenium (Ru), ruthenium oxide ($RuO_2$), iridium (Ir), iridium oxide $IrO_2$, and platinum (Pt).

Among these metals, ruthenium, platinum (Pt), and iridium oxide ($IrO_2$) are preferably used, because these metals have a high corrosion resistance for preventing the dielectric material from fatigue deterioration.

Moreover, from a point of view of securing the electrostatic property, the nickel oxide compound layer is preferably formed by using lanthanum nickelate or lithium nickelate.

Each of the titanium layer, the barrier layer, and the nickelate compound layer may be formed by a sputtering method, at a temperature in a range of not lower than ordinary room temperature to approximately 150° C.

Herein, the titanium layer, the barrier layer, and the nickelate compound layer are preferably formed by the sputtering method described in below, because it is easy to form a metallic thin film having a high degree of purity at a high film forming speed. Alternatively, the temperature at the time of sputtering is preferable in the range of ordinary room temperature to approximately 150° C., because it is difficult to perform a uniform film forming at a temperature not higher than the ordinary room temperature.

As the sputtering method, there are mentioned, for example, a two-electrode sputtering method such as a DC (direct current) sputtering method and radio frequency (RF)

sputtering method; a magnetron sputtering method such as a planar magnetron sputtering method, a compressed magnetic field magnetron sputtering method, a sputter-gun sputtering method, and a coaxial sputtering method, an opposed target sputtering method, an electron cyclotron resonance (ECR) sputtering method, a collimated sputtering method and a long-distance sputtering method, an ion-beam sputtering method, and a reactive sputtering method, and so forth.

The nickelate compound layer mentioned above is preferably formed by the reactive sputtering method, because there are advantages such that highly densified layer having a uniform composition and high degree of purity is formed.

Moreover, the dielectric material layer is preferably formed by using a compound selected from a group consisting of barium titanate, ($BaTiO_3$), strontium titanate ($SrTiO_3$), and $barium_{1-x}$ $strontium_x$ titanate ($Ba_{1-x}Sr_xTiO_3$), lead zirconate titanate ($Pb(ZrTi)O_3$), lead titanate ($PbTiO_3$), and bismuth titanate ($Bi_4Ti_3O_{12}$). Herein, x denotes the decimal not less than 0.05 but not greater than 0.95. When x is in this range, it is possible to secure desired functions as a capacitor without losing electrostatic properties. Alternatively, the film is formed easily.

Among these compounds, barium titanate, strontium titanate, lead zirconate titanate, and lead titanate are preferably used, in order to obtain a capacitor having a desired electrostatic capacity per unit area.

Moreover, the dielectric material layer is preferably formed by the sputtering method at a temperature, not lower than approximately 200° C. but not higher than approximately 400° C. More preferably, the dielectric material layer is formed by the reactive sputtering method, since the deviation of composition is not easily occurred, and high electric power can be applied.

By performing the sputtering in the abovementioned temperature range, uniform film may be formed with small effect of a yield stress on the metal and a crystalline structure. Therefore, the capacitance having a desired capacity may be manufactured, without losing the physical properties.

A coefficient of thermal expansion of the dielectric material layer ($\alpha 1$) and that of the metallic thin film for wiring ($\alpha 2$) preferably satisfies the following equation (1):

$$(\alpha 1 - \alpha 2)\Delta T \times 100 \geq 0.1 \quad (1)$$

(wherein, $\Delta T$ denotes a temperature difference between the ordinary room temperature and a heating temperature of the metallic thin film for wiring at the time of forming the dielectric layer).

When the dielectric material layer and the metallic thin film are formed of materials having the difference in the coefficient of thermal expansion as mentioned in equation (1), denseness of the dielectric material layer is preferably in a range of approximately 70% to 95%.

Alternatively, the dielectric material layer is preferably formed so as to cover the entire first electrode as mentioned above. Since this dielectric material layer is subjected to a stress from another substrate in contact via the second electrode formed of gold or platinum, it may be to distribute the stress and to prevent a leak.

The present invention is a method for manufacturing thin-film embedded capacitance which comprises steps of: forming a first electrode on a metallic thin film for wiring made of a metallic material in a non-yield state, at a temperature in a range of not lower than ordinary room temperature to not higher than a yield temperature; forming a dielectric material layer so as to cover the first electrode while heating the metallic film for wiring at the temperature in the range of not lower than the ordinary room temperature to not higher than the yield temperature, and forming the second electrode made of a precious metal is formed on the dielectric material layer.

The first electrode, the dielectric material layer, and the second electrode are preferably formed by the sputtering method.

Herein, the first electrode is preferably formed by a method which comprises steps of: forming a titanium layer formed on the metallic thin-film for wiring at a temperature in a range of a ordinary room temperature to approximately 150° C.; forming a barrier layer formed so as to cover the titanium layer; and forming a nickelate compound layer so as to cover the barrier layer.

The titanium layer, the barrier layer, and the nickelate compound layer are preferably formed by the sputtering method.

According to this method, the capacitance having a desired capacity per unit area may be obtained.

Herein, the non-yield state metallic material, the metallic material forming the barrier layer which forms the second electrode, and the dielectric material are as described above. Alternatively, a relationship between the coefficient of thermal expansion of the dielectric material layer ($\alpha 1$) and the coefficient of thermal expansion of the metallic thin film for wiring ($\alpha 2$) is also as described in equation (1), and the denseness of the dielectric material layer is also as described above. Furthermore, the second electrode is made of gold or platinum.

The present invention, moreover, is a printed wiring board in which the thin-film embedded capacitance described above is disposed at least in one of an internal layer and an external layer.

According this printed wiring board, the capacitance may be disposed at the optimum position, thereby stabilizing an operation for a signal in a wide range of frequency.

According to the capacitance of the present invention, it is possible to provide, and to facilitate to secure a close adhesion between the electrode and the metal.

Moreover, according to the method for manufacturing the capacitance of the present invention, a thin-film embedded capacitance in which the disposition of the capacitance is optimized may be manufactured.

Furthermore, according to the printed wiring board of the present invention, a printed wiring board comprising a thin-film embedded capacitance having a large electrostatic capacity per unit area, optimizing the disposition of the capacitance, may be provided.

BRIEF DESCRIPTION OF DRAWINGS

FIG. 2 is a cross-sectional view showing a schematic structure of a thin-film embedded capacitance module in FIG. 1;

FIG. 3 is a diagram (no. 1) for describing a manufacturing process of the thin-film embedded capacitance module in FIG. 2;

FIG. 4 is a diagram (no. 2) for describing the manufacturing process of the thin-film embedded capacitance module in FIG. 2;

FIG. 5 is a diagram (no. 3) for describing the manufacturing process of the thin-film embedded capacitance module in FIG. 2;

FIG. 6 is a diagram (no. 4) for describing the manufacturing process of the thin-film embedded capacitance module in FIG. 2;

FIG. 7 is a diagram (no. 5) for describing the manufacturing process of the thin-film embedded capacitance module in FIG. 2;

FIGS. 8A to 8C are a diagram (no. 1) for describing a manufacturing process of a printed wiring board for embedding the thin-film embedded capacitance in FIG. 1;

FIGS. 9A and 9B are a diagram (no. 2) for describing the manufacturing process of the printed wiring board for embedding the thin-film embedded capacitance in FIG. 1;

BEST MODE FOR CARRYING OUT THE INVENTION

An embodiment of the present invention will be described below while referring to FIG. 1 to FIG. 11.

Figure 1:
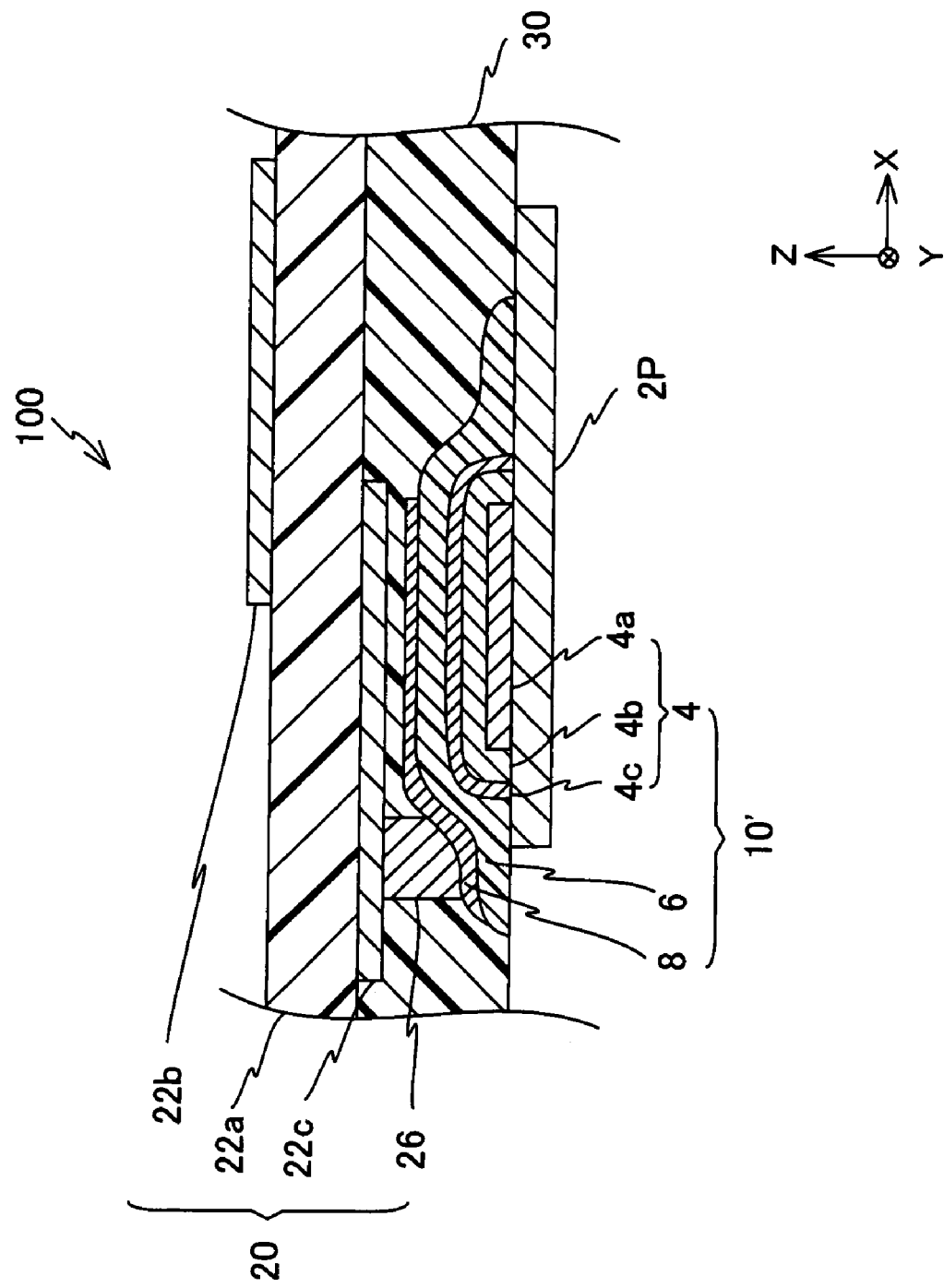
FIG. 1 is a cross-sectional view showing a schematic structure of an embodiment of a printed wiring board, in which a thin-film embedded capacitance according to the present invention is embedded.

In FIG. 1, a structure of a printed wiring board 100 in which a thin-film embedded capacitance 10' according to the embodiment of the present invention is shown in an XZ cross-sectional view. This printed wiring board 100 is a printed wiring board in which one thin-film embedded capacitance is embedded in a printed wiring member 20.

As shown in FIG. 1, this printed wiring board 100 comprises (a) an insulating layer 22a and (b) a conductor pattern 22b (hereinafter, called as an "external layer pattern 22b") which is formed on a -Z direction surface of the printed wiring member 20.

Moreover, the printed wiring board 100 comprises (c) a conductor pattern 22c (hereinafter, called as an "internal layer pattern 22c"), and (d) an Sn bump and other electroconductive connecting member 26 formed on a -Z direction surface of the internal layer pattern 22c. Note that the printed wiring member 20 comprises the insulating layer 22a, the conductor patterns 22b and 22c, and the electroconductive connecting member 26.

Alternatively, the printed wiring board 100 further comprises (e) an adhesive layer 30 formed by using an insulating adhesive, on a -Z direction surfaces both of the internal layer pattern 22c and the insulating layer 22a, (f) the thin-film embedded capacitance 10' which is embedded near a -Z direction surface of the adhesive layer 30, and (g) a conductor pattern 2P which is formed on a -Z direction surfaces both of the thin-film embedded capacitance 10' and the adhesive layer 30.

Herein, the thin-film embedded capacitance 10' comprises the first electrode 4, a dielectric material layer 6, and the second electrode 8. Moreover, when the first electrode 4 is electrically connected to the conductor pattern 2P, the second electrode 8 is electrically connected to the internal layer pattern 22c via the electroconductive connecting member 26. Note that a detailed structure of the thin-film embedded capacitance 10' will be described later.

Alternatively, although it is omitted in the diagram, a via hole for an interlayer connection via the insulating layer 22a is formed when deemed appropriate. Furthermore, a via hole for the interlayer connection between the insulating layer 22a and the adhesive layer 30 is also formed when deemed appropriate.

As a material for the insulating layer 22a, a material such as an epoxy resin, a material in which an epoxy resin is impregnated in a glass fabric (hereinafter, sometimes called as a "glass epoxy" or a "prepreg"), a polyimide, and the like may be preferably used. The glass epoxy is preferably used from points of view of a dimensional stability, a mass-productiveness, and a thermal stability.

As a material for the conductor patterns 22b and 22c, a conductor metal such as copper, aluminum, stainless steel, and the like may be used, and copper is preferably used because of good processability.

In FIG. 2, a structure of a thin-film embedded capacitance module 10 which is used for manufacturing the printed wiring board 100, including the thin-film embedded capacitance 10' is shown in an XZ cross-sectional view.

As shown in FIG. 2, the thin-film embedded capacitance module 10 is formed on a carrier with a conductor film on which metallic thin films for wiring 2 and 3 are laminated, on a +Z direction surface and a -Z direction surface of a supporting member (hereinafter, also called as a "carrier member" or a "carrier") 1, respectively. Herein, the carrier member comprises an insulating layer 1a, and electroconductive films 1b and 1c. Note that the metallic thin film for wiring can be formed on at least the +Z direction surface of the carrier member 1.

Although not shown in FIG. 2, a concave-convex is formed on the entire +Z direction surface of the metallic thin film for wiring 2 and the entire -Z direction surface of the metallic thin film for wiring 3, and the surfaces of them are roughened. Moreover, a surface roughness (Rz) of the +Z direction surface of the metallic thin film for wiring 2 is not greater than 0.5 µm.

Herein, as a material of the metallic thin film for wiring 2, an electroconductive metal such as copper, aluminum, stainless steel, and the like may be used. Taking into consideration embedding the capacitance as it will be described later, copper may be preferably used.

Alternatively, when a copper thin film is used, a shinny copper foil having the surface roughness (Rz) 0.5 µm or less is preferably used.

As it has been described above, the thin-film embedded capacitance module 10 comprises the first electrode 4 and the second electrode 8. The first electrode 4 comprises a titanium layer 4a, a barrier layer 4b which is formed so as to cover the titanium layer 4a, and a nickelate compound layer 4c which is formed to cover the barrier layer 4b.

In a titanium layer used for forming the first electrode 4, the same titanium compound used in the sputtering may be generally used.

Moreover, the barrier layer 4b is not restricted to any particular material provided that the barrier layer 4b is formed of a metal which enables to form the barrier layer. However, the barrier layer 4b is preferably formed by a metal selected from the group consisting of ruthenium, ruthenium oxide, iridium, iridium oxide, and platinum, because these metals protect to leak an electrified charge.

Among these metals, a metal selected from the group consisting of ruthenium, iridium oxide, and platinum is preferably used, from a point of view of preventing deterioration by a fatigue of a dielectric material while maintaining a desired corrosion resistance.

The nickelate compound layer 4c is preferably formed by using lanthanum nickelate or lithium nickelate, because these metals have a desired electrostatic properties.

Each of the titanium layer 4a, the barrier layer 4b, and the nickelate compound layer 4c is preferably formed by the sputtering method, while heating the carrier 1 to a temperature in a range of not lower than the ordinary room temperature to approximately 150° C., in order to form a uniform film easily at a temperature in this temperature range.

Furthermore, the thin-film embedded capacitance module 10 of the present invention comprises the dielectric material layer 6 having a coefficient of thermal expansion smaller than that of the metallic thin film for wiring 2, which is formed by the sputtering method on both of the metallic thin film for wiring 2 and the first electrode 4 in the structure described above.

That is, as shown in FIG. 2, the dielectric material layer 6 covers entirely the first electrode 4, and is in contact with the +Z direction side surface of the metallic thin film for wiring 2.

The material of the dielectric material layer 6 is preferably selected from the group consisting of barium titanate, strontium titanate, and barium$_{1-x}$ strontium$_x$ titanate, lead zirconate titanate, and lead titanate. In order to obtain the desired electrostatic capacity of the thin-film embedded capacitance module 10, these metal compounds have a preferable dielectric constant.

The compound selected from the group consisting of strontium titanate, barium titanate, and lead zirconate titanate is more preferably used, because these compounds have excellent electrostatic properties. Herein, x denotes a decimal from 0.05 to 0.95 for a reason similar to the reason mentioned above.

Moreover, the dielectric material layer 6 is preferably formed by the sputtering method, at a temperature in a range of approximately 200° C. to approximately 400° C. This dielectric material layer 6 is preferably formed by the reactive sputtering, while heating the carrier 1 to a temperature in the range of approximately 200° C. to approximately 400° C. When the dielectric material layer 6 is formed at a temperature in this temperature range, uniform layer is easily formed, and few defect such as a crack occurs in the dielectric material layer 6.

Furthermore, the dielectric material layer 6 becomes a base for forming the second electrode 8, which will be described later. The dielectric material layer 6 is also a component which receives a stress from such printed wiring board via the second electrode 8, when it is embedded in various other printed wiring boards.

Therefore, with a restriction according to a size of the thin-film embedded capacitance module 10, the dielectric material layer 6 is preferably formed such that a surface area of the dielectric material layer 6 is as wide as possible. By using these structures, the stress is distributed and the leak is prevented.

Herein, the coefficient of thermal expansion of the dielectric material forming the dielectric material layer 6 ($\alpha 1$), and that of the metallic thin film for wiring ($\alpha 2$) preferably satisfy the following equation (1):

$$(\alpha 2 - \alpha 1)\Delta T \times 100 \geq 0.1 \tag{1}$$

(wherein, $\Delta T$ denotes the temperature difference between the ordinary room temperature and a heating temperature of the metallic thin film for wiring at the time of forming the dielectric material).

By selecting metals of a combination which satisfy the relationship in equation (1), dielectric material layer 6 having a denseness of approximately 50% may be obtained.

The thin-film embedded capacitance module 10 of the present invention further comprises the second electrode 8 on the +Z direction surface of the dielectric material layer 6.

The second electrode 8 is preferably formed of gold or platinum. By forming the second electrode 8 as large as possible on the +Z direction surface of the dielectric material layer 6, it is possible to distribute the stress.

Next, a manufacturing process of the printed wiring board 100 will be described below.

First of all, the thin-film embedded capacitance module 10 as shown in FIG. 2 is manufactured. Herein, the thin-film embedded capacitance module 10 comprises (i) the carrier with conductive film on which the metallic thin film for wiring 2 such as a copper film is laminated on the +Z direction surface of the supporting member (also called as the "carrier member" or the "carrier") 1, and the metallic thin film for wiring 3 similar to the metallic thin film for wiring 2 is laminated on the −Z direction surface of the supporting member 1, and (ii) the thin-film embedded capacitance 10' which is formed on the +Z direction surface of the metallic thin film for wiring 2.

As the carrier member 1, a member comprising the insulating layer 1a, and a conductive film 1b laminated at least on a +Z direction of the insulating layer 1a is preferably used. As mentioned above, the epoxy resin, the glass epoxy, the polyimide, and the like may be preferably used as the material for the insulating layer 1a, and the glass epoxy is more preferably used from points of view of the dimensional stability, the mass productiveness, and the thermal stability. When the conductive film 1c is formed on the −Z direction surface of the insulating layer 1a, the conductive films 1b and 1c may be formed of the same electroconductive metallic material, or of different electroconductive metallic materials.

In FIG. 2, there is shown a case, wherein the carrier 1 with the conductive film, being laminated the conductive film 1c also on the −Z direction surface of the insulating layer 1a of the carrier member 1, is used. However, as mentioned above, the carrier 1 having the conductive film 1b on at least the +Z direction surface of the insulating layer 1a may be used.

The +Z direction surface of the metallic thin film for wiring 2, which is formed on the +Z direction surface of the carrier member 1, is roughened such that an average roughness (Rz) is not greater than a predetermined value.

The carrier 1 with the conductive film mentioned above may be manufactured by adhering the metallic thin film for wiring 2 by contact bonding on the +Z direction side surface of the supporting member 1, or may be selected from commercially available ones. As examples of the commercially available ones, there are mentioned, Micro-Thin (manufactured by MITSUI KINZOKU (Mitsui Mining & Smelting Co., Ltd.)), XTR (manufactured by Olin Brass Co.), and UTC-Foil (manufactured by METFOILS AB), and so forth.

At the time of manufacturing the thin-film embedded capacitance module 10, first of all, the carrier 1 with the metallic thin film for wiring is prepared. Next, a mask M1 having an aperture of a predetermined size, is mounted on the +Z direction surface of the metallic thin film for wiring 2 (see FIG. 3A). Next, while heating the carrier member at a temperature in the range of the ordinary room temperature to about 150° C., the titanium layer 4a for forming the first electrode 4 is formed by the sputtering method, and then, the mask M1 is removed (see FIG. 3B)

Subsequently, another mask M2 having an aperture of a size covering the titanium layer 4a is mounted on a +Z direction surface of the conductive film 1b (see FIG. 4A). Next, while heating the carrier member at a temperature in the range of the ordinary room temperature to 150° C., the barrier layer 4b for forming the first electrode 4 is formed by the sputtering method. Then, the mask M2 is removed (see FIG. 4B).

Herein, at the time of forming the barrier layer 4b, the reactive sputtering method including oxygen gas in its atmosphere is preferably employed; because a composition of the barrier layer 4b formed is not varied so easily, and to apply high electric power is anticipated.

The metal compound used for forming the barrier layer 4b is not restricted to any particular compound, but a metal compound selected from a group consisting of ruthenium oxide, iridium, iridium oxide, and platinum is preferable from a point of view of corrosion resistance. Ru or Pt is used even more preferably for having a desired corrosion resistance, and preventing the fatigue deterioration of the dielectric material.

Moreover, an advantageous effect hard to leak the electric charge accumulated can be anticipated by using these metals.

Next, another mask M3 having an aperture of a size covering the barrier layer 4b is mounted on the +Z direction surface of the conductive film 1b (see FIG. 5A). Subsequently, while heating the carrier member at a temperature in the range of the ordinary room temperature to about 150° C., the nickelate compound layer 4c which forms the first electrode 4 is formed by the sputtering method. After forming the nickelate compound layer 4c, the mask M3 is removed (see FIG. 5B).

Herein, when the nickelate compound layer 4c is formed, the reactive sputtering method in which oxygen gas in included in the atmosphere is preferably employed; because it is anticipated that the composition of the nickelate compound layer 4c is not deviated so easily, and the high electric power is applied.

The nickelate compound used for forming the nickelate compound layer 4c is as mentioned above; and lanthanum nickelate or lithium nickelate is preferably used for securing the desired electrostatic properties.

By employing the above-mentioned process, the first electrode 4 is formed.

Next, another mask M4 having the aperture of the size covering the nickelate compound layer 4c is mounted on the +Z direction surface of the conductor film 1b (see FIG. 6A). Subsequently, while heating the carrier member at a temperature in the range of approximately 200° C. to 400° C., the dielectric material layer 6 is formed by using the sputtering method (see FIG. 6B). Masks made of stainless steel may be used as the masks 1 to 4 mentioned above.

The dielectric material layer 6 is preferably formed of a material selected from a group consisting of barium titanate, strontium titanate, barium$_{1-x}$ strontium$_x$ titanate (wherein, x denotes a decimal from 0.05 to 0.95), lead zirconate titanate, lead titanate, and a bismuth titanate, for a reason that the thin-film embedded capacitance having a high electrostatic capacity per unit area is obtained. When the material selected from a group consisting of barium titanate, strontium titanate, lead zirconate titanate, and lead titanate is used, the thin-film embedded capacitance having a higher electrostatic capacitance per unit area is obtained.

Herein, the coefficient of thermal expansion ($\alpha$1) of the dielectric material forms the dielectric material layer 6, and that ($\alpha$2) of the metallic thin film for wiring 2 (are values which) preferably satisfy the above-mentioned equation (1). When copper is preferably used as the metallic thin film for wiring 2 and strontium titanate is preferably used as the compound forming the dielectric material layer 6, the thin-film embedded capacitance 10' having a very high electrostatic capacity per unit area is produced. The denseness of the dielectric material layer 6 in this case is approximately 50%.

Subsequently, another mask M5 having a desired size such that an aperture is a part of the dielectric material layer 6, is mounted on a +Z direction surface of the dielectric material layer 6 (see FIG. 7A). The second electrode 8 is then formed by the sputtering method by using gold or platinum. After forming the second electrode 8, the mask M5 is removed (see FIG. 7B).

As described above, the second electrode 8 is formed, thereby the thin-film embedded capacitance module 10 is manufactured.

Next, a method for manufacturing the printed wiring member 20 will be described below. The printed wiring member 20 is manufactured concurrently while manufacturing the thin-film embedded capacitance module 10, or independently.

A dry film resist 24U is laminated on an entire +Z direction surface of a carrier member 22 with conductive film with conductive films (22L and 22U) on both sides (see FIG. 8A), and a dry film resist 24L is also laminated in a -Z direction of the conductive film 22L. As the dry film resist, there are mentioned, for example, HW 440 (manufactured by Hitachi Chemical Co., Ltd.), and so forth. The carrier members which may be used here are as mentioned above.

Next, by using a photolithography method, a recess is formed by removing the dry film resist on an area except an area on a +Z direction surface of the conductor film 22, on which the conductive pattern 22b is to be formed. Moreover, a recess is formed by removing the dry film resist on an area on a -Z direction side surface of the conductive film 22L, on which the conductor pattern 22a is to be formed (see FIG. 8B).

An etching is then performed by using a predetermined etching agent, and the conductive patterns 22b and 22c are formed. Subsequently, the dry film resists are removed (see FIG. 8C).

Next, a resist layer is formed by applying a liquid resist for example, on each of the -Z direction surface of the conductive pattern 22c, which is formed on the -Z direction surface of the insulating layer 22a, and the +Z direction surface of the conductive pattern 22b, which is formed on the +Z direction surface of the insulating layer 22a. Then, by using the photolithography method, the resist layer on an area forming the electroconductive connecting member 26 which will be described later is removed from the resist layer formed on the -Z direction side surface of the conductor pattern 22c. In the recess formed by this process, the desired size of the -Z direction surface of the conductive film in the area wherein the electroconductive connecting member 26 is exposed.

As the liquid resist in this process, for example, PER-20 (manufactured by TAIYO INK MFG. CO., LTD.) may be used.

The electroconductive connecting member 26 is then formed on the conductive film exposed as described above, and the printed wiring member 20 is manufactured (see FIG. 9A).

Herein, as the electroconductive connecting member to be formed here, there are mentioned Sb, Au, Ag, and the like, apart from Sn bump shown in FIG. 9A.

Note that a through hole is formed at a desired position by using a drill and so forth, and then the inner surface of the through hole is plated, thereby a via hole for interlayer connection between the internal layer pattern 22c and the external layer pattern 22b of the printed wiring member 20 is formed.

After that, an insulating adhesive of which main ingredient is an epoxy resin is coated so as to cover both of the insulating layer 22a and the conductor pattern 22c (see FIG. 9B); then the second electrode of the thin-film embedded capacitance module 10 of the present invention which is manufactured as described above, and the electroconductive connecting member are overlapped to face mutually.

Figure 10:
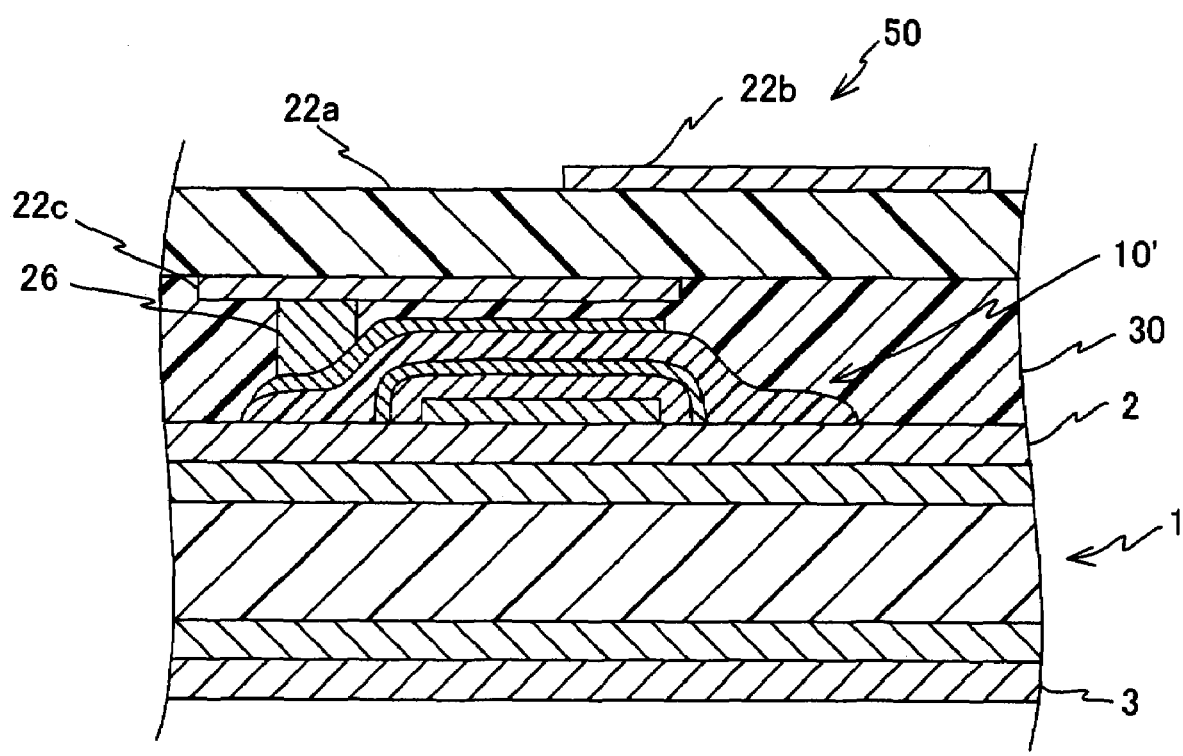
FIG. 10 is a diagram (no. 1) for describing a manufacturing process of the printed wiring board in FIG. 1.

Subsequently, by heating under desired conditions, for example, at approximately 185° C., approximately 40 kg/m$^2$, for 1 hr, a laminated body 50, in which the thin-film embedded capacitance module 10 is stacked to the printed wiring member 20 via the adhesive layer 30, is manufactured (see FIG. 10). In this stage, the second electrode 8 is connected to the internal layer pattern 22c of the printed wiring member via the electroconductive connecting member 26.

Figure 11:
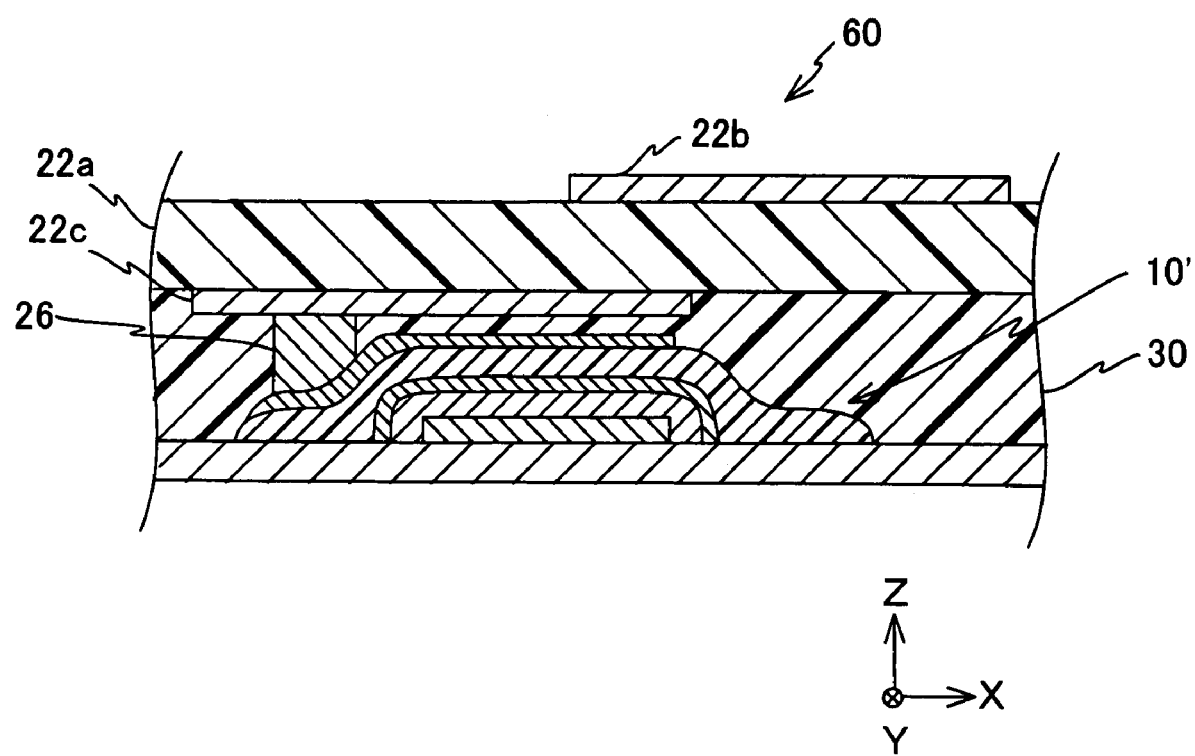
FIG. 11 is a diagram (no. 2) for describing the manufacturing process of the printed wiring board in FIG. 1.

Next, from the laminated body 50, the carrier member 1 is peeled off according to an established method, leaving the metallic thin film for wiring 2 to produce a laminated body 60 (see FIG. 11).

Subsequently, the dry film resist is laminated on the −Z direction surface of the metallic thin film for wiring 2 to form a resist layer. Moreover, another resist layer is formed similarly on the +Z direction surface both of the conductive pattern 22b and the insulating layer 22a.

Next, from the −Z direction surface of the metallic thin film for wiring 2, the resist layer is removed, leaving an area on which a wiring pattern 2P is formed. After that, an etching is performed according to the standard method to form the wiring pattern 2P, and the resist layer formed on the +Z direction surface of the conductive pattern 22b and the insulating layer 22a is removed.

Note that the through hole is formed at a predetermined position by using the drill and the like, and the inner surface of the through hole is plated as described above; thereby the via hole for continuity connection between the wiring pattern 2P and the external layer pattern 22b of the printed wiring member 20 is formed appropriately.

Thus, the printed wiring board 100 in which the thin-film embedded capacitance 10' is embedded at a desired position is manufactured (see FIG. 1).

Note that a solder resist is formed on a +Z direction surface and a −Z direction side surface of the printed wiring board 100, however, it is not shown on the figure.

EXAMPLES

Characteristics of the thin-film embedded capacitance of the present invention, and a printed wiring board 100 in which the thin-film embedded capacitance is embedded will be described below in detail by using examples. In the following examples, the description will be made by giving examples of the thin-film embedded capacitance, in which chemical compounds described later are used. However, the present invention is not restricted to the following examples.

[1] Manufacturing of Thin-film Embedded Capacitance Module (1) Example 1 to Example 3

As the supporting member, an ultra thin copper film with carrier (Micro-Thin, manufactured by Mitsui Mining & Smelting Co., Ltd.) was used as a conductive film with carrier of which, a surface is roughened. In this ultra thin copper film with carrier, a copper layer of a thickness 3.5 μm is formed, and a roughness (Rz) of the surface of the copper layer is 1.2 μm.

Moreover, each of layers shown in the following table 1 is formed by the sputtering with chemical compounds. A sputtering system manufactured by Leybold Co., Ltd. was used.

Upon mounting a mask made of stainless steel having an aperture of about 300 nm×300 nm on this copper layer, the sputtering was performed according to conditions shown in table 1 below to form a titanium layer having a thickness of approximately 500 Å (50 nm).

Next, the sputtering was performed according to the conditions shown in the table 1 below to form a ruthenium layer having a thickness of approximately 2000 Å (200 nm) as a barrier layer.

Furthermore, the reactive sputtering was performed according the conditions shown in table 1 to form a lanthanum nickelate (LaNiO$_3$) layer having a thickness of approximately 500 Å (50 nm) as a nickelate compound layer.

TABLE 1

| | First electrode | | | | Second electrode |
|---|---|---|---|---|---|
| | Titanium layer | Barrier layer | Nickelate compound layer | Dielectric material layer | |
| Heating temperature | Not heating | 150° C. | 150° C. | 300° C. | 150° C. |
| RF | 300 W 4 Rev/1 RPM | 300 W 8 Rev/1 RPM | 200 W 60 Rev/1 RPM | 200 W 60 Rev/1 RPM | 300 W 40 seconds in stationary |
| Ar | 35 sccm | 35 sccm | 35 sccm 3% O$_2$ | 35 sccm 3% O$_2$ | 35 sccm |
| Pressure (atm) | 1.3 × 10$^{-2}$ | 1.7 × 10$^{-2}$ | 1.7 × 10$^{-2}$ | 1.7 × 10$^{-2}$ | 1.7 × 10$^{-2}$ |

Next, the reactive sputtering was performed according to the conditions in table 1 shown above to form a strontium titanate (SrTiO$_3$) dielectric material layer having a thickness of approximately 2000 Å (200 nm) so as to cover the entire first electrode and a thin copper film for wiring.

Subsequently, according to the conditions in table 1 shown above, the second electrode was formed by using platinum, and the thin-film embedded capacitance module of Example 1 to Example 3 were formed.

[2] Manufacturing of the Printed Wiring Board 100 in which the Thin-film Embedded Capacitance 10' is Embedded.

(1) Manufacturing of the printed wiring member 20

Dry film resist HW 440 (manufactured by Hitachi Chemical Co., Ltd.) was laminated entirely on both surfaces of the carrier member 1, which includes a conductor film on both sides.

Next, by the photolithography method under the condition of a quantity of light 110 mJ, a developing was performed for 30 seconds with $Na_2CO_3$ as a developing solution, the dry film resist was removed leaving a predetermined area on which the conductive pattern is formed.

The etching was then performed by using cupric chloride etchant to form the conductor patterns 22b and 22c. After that, the dry film resist was removed.

Next, the dry film resist HW 440 (manufactured by Hitachi Chemical Co., Ltd.) was laminated on the conductive pattern 22b formed on the carrier member, and the entire surface of the carrier member on which the conductor pattern 22b is formed. Alternatively, the dry film resist mentioned above was also laminated on the surface of the carrier member on which the conductive pattern 22c is formed.

The photolithography was performed under the similar conditions mentioned above to remove the resist on an area of the conductive pattern 22c, on which the electroconductive connecting member 26 is formed.

Next, by using a drill and so forth, the through hole was formed, and inner surface of the through hole and the area around the opening of the through hole were plated by using the plating solution having the following composition, for 60 minutes at 1.2 $A/dm^2$ under conditions shown in table 4.

TABLE 2

| Plating solution composition | |
|---|---|
| Compound name | Amount |
| Sulfuric acid | 21 mol/l |
| Copper sulfate | 0.26 mol/l |
| PEG | 10 ml/l |

An insoluble component was removed by using a plating resist. Subsequently, an Sn bump was formed in this area, and the printed wiring member 20 was manufactured.

After that, the adhesive was coated so as to cover both of the carrier member and the conductor pattern; then the second electrode of each thin-film embedded capacitance manufactured in [1] mentioned above and the Sn bump were overlapped to face mutually.

Subsequently, the laminated body 50 was manufactured by heating at approximately 185° C. under a pressure of approximately 40 $kg/m^2$. From this laminated body 50, the carrier member 1 was peeled off leaving except the metallic thin film 2 for wiring to form the laminated body 60.

The resist was formed by using HW 440 on the entire surface of the laminated body 60. The photolithography was performed under the same conditions as mentioned above, and the resist on the metallic thin film for wiring was removed leaving the area on which the wiring pattern 2P is to be formed.

Next, the etching was performed by using the cupric chloride etchant and the wiring pattern 2P was formed. After that, the remaining resist was removed.

Subsequently, a via hole for the interlayer connection between the wiring pattern 2P and the internal layer pattern 22c was formed in a similar manner as mentioned above.

Next, by providing a solder mask, the printed wiring board 100 (Example 1 to Example 3 and Comparative Examples 1 and 2), in which the thin-film embedded capacitance is embedded at a desired position was manufactured. Herein, a diameter of the embedded capacitance in the board was 0.5 mm.

[3] Physical Property Value of the Printed Wired Board of Examples 1 to 3

An evaluation of each printed wiring board manufactured in [2] is shown in table 5. In table 5, a presence or an absence of a crack was confirmed by cutting the printed wiring board so as to include a wiring portion, and observing a cross-section of the cut printed wiring board under a microscope (100 times magnification).

Moreover, an existence or a non-existence of a leak current was confirmed by measuring by ultrahigh resistor (Resistance meter R8340, manufactured by ADVANTEST CORPORATION) after applying a voltage of 100 V between the external layer pattern 22b and the wiring pattern 2P, and then raising a temperature to 150° C.

Furthermore, reliability was evaluated by performing 3,000 cycles under heat-cycle conditions (one cycle is −60° C./3 minutes and 140° C./3 minutes) and observing the presence and the absence of a crack. In table 5, "no occurrence" of a crack is shown as "OK" and "an occurrence" of a crack is shown as "No".

TABLE 3

| | Example | | |
|---|---|---|---|
| Evaluation item | 1 | 2 | 3 |
| Capacity (nF) | 0.6 | 0.4 | 0.7 |
| ϵ | 80 | No | 100 |
| Crack | No | No | No |
| Leak | No | No | No |
| Reliability | OK | OK | OK |

As shown in table 5, in the Example 1 to Example 3, the capacity was in a range of 0.4 to 0.7 $nF/mm^2$, and ϵ was in a range of 80 to 100. The denseness of the dielectric material layer was approximately 50%, based on these values.

As described above, since the present invention provides a capacitance having a small size but a large capacity, there are fewer restrictions at the time of disposing the capacitance on various printed wiring boards. Consequently, it is useful as a printed wiring board having a satisfactory stability of operation. Note that any modifications and alternative constructions fall within the technical scope of the invention.

What is claimed is:

1. A thin-film embedded capacitance comprising:
   a first electrode which is formed on a metallic thin film for wiring made of a metallic material in a non-yield state, the first electrode comprising a titanium layer formed on the metallic thin film, a barrier layer formed to cover the titanium layer and a nickelate compound layer formed to cover the barrier layer;
   a dielectric material layer which is formed on the first electrode and the metallic thin film for wiring, the dielectric material layer being formed at a temperature not lower than an ordinary room temperature and lower than a yield temperature of the metallic thin film for wiring, and having a coefficient of thermal expansion lower than a coefficient of thermal expansion of the metallic thin film for wiring; and a second electrode which is formed on the dielectric material layer.

2. The thin-film embedded capacitance according to claim 1, wherein the metallic material in the non-yield state comprises copper.

3. The thin-film embedded capacitance according to claim 1, wherein the barrier layer is a thin film comprising a metal selected from the group consisting of ruthenium, ruthenium oxide, iridium, iridium oxide, and platinum.

4. The thin-film embedded capacitance according to claim 1, wherein the nickelate compound layer comprises one of lanthanum nickelate and lithium nickelate.

5. The thin-film embedded capacitance according to claim 1, wherein each of the titanium layer, the barrier layer, and the nickelate compound layer is formed at a temperature in a range of an ordinary room temperature to approximately 150° C.

6. The thin-film embedded capacitance according to claim 1, wherein the dielectric layer comprises a material selected from the group consisting of barium titanate, strontium titanate, $barium_{1-x}$ $strontium_x$ titanate, lead zirconate titanate, lead titanate, and bismuth titanate, where x denotes a decimal not less than 0.05 and no greater than 0.95.

7. The thin-film embedded capacitance according to claim 1, wherein the dielectric material layer is formed by a sputtering method carried out at a temperature in a range of not lower than 200° C. and not greater than 400° C.

8. The thin-film embedded capacitance according to claim 7, wherein the dielectric material layer has the coefficient of thermal expansion ($\alpha 1$), the metallic thin film for wiring has the coefficient of thermal expansion ($\alpha 2$), and a following equation (1) is satisfied:

$$(\alpha 2-\alpha 1)\Delta T \times 100 \geq 0.1 \qquad (1)$$

where $\Delta T$ denotes a temperature difference between an ordinary room temperature and a heating temperature of the metallic thin film for wiring at a time of forming the dielectric material layer.

9. The thin-film embedded capacitance according to claim 1, wherein the second electrode comprises one of gold and platinum.

10. A printer circuit board comprising: the thin-film embedded capacitance according to claim 1, wherein the metallic thin film is disposed at least in one of an internal layer and an external layer.

11. A method for manufacturing thin-film embedded capacitance comprising:

forming a first electrode on a metallic thin film for wiring made of a metallic material in a non-yield state, at a temperature in a range of not lower than an ordinary room temperature to lower than a yield temperature;

forming a dielectric material layer so as to cover the first electrode, while heating the metallic thin film for wiring at the temperature in the range of not lower than the ordinary room temperature to lower than the yield temperature; and forming a second electrode made of a noble metal on the dielectric material layer, wherein the forming of the first electrode comprises forming a titanium layer on the metallic thin-film at a temperature in a range of an ordinary room temperature to approximately 150° C., forming a barrier layer so as to cover the titanium layer and forming a nickelate compound layer to cover the barrier layer.

12. The method for manufacturing thin-film embedded capacitance according to claim 11, wherein the metallic material in the non-yield state comprises copper.

13. The method for manufacturing thin-film embedded capacitance according to claim 11, wherein the barrier layer is a thin film comprising a metal selected from the group consisting of ruthenium, ruthenium oxide, iridium, iridium oxide, and platinum.

14. The method for manufacturing thin-film embedded capacitance according to claim 11, wherein the nickelate compound layer comprises lanthanum nickelate.

15. The method for manufacturing thin-film embedded capacitance according to claim 11, wherein the dielectric layer comprises a material selected from the group consisting of barium titanate, strontium titanate, $barium_{1-x}$ $strontium_x$ titanate, lead zirconate titanate, lead titanate, and bismuth titanate, where x denotes the decimal from not less than 0.05 and not greater than 0.95.

16. The method for manufacturing thin-film embedded capacitance according to claim 11, wherein the dielectric material layer has a coefficient of thermal expansion ($\alpha 1$), the metallic thin film for wiring has a coefficient of thermal expansion ($\alpha 2$), and a following equation (1) is satisfied:

$$(\alpha 2-\alpha 1)\Delta T \times 100 \geq 0.1 \qquad (1)$$

where $\Delta T$ denotes a temperature difference between an ordinary room temperature and a heating temperature of the metallic thin film for wiring at a time of forming the dielectric material layer.

17. The method for manufacturing thin-film embedded capacitance according to claim 11, wherein the second electrode comprises one of gold and platinum.

18. A thin-film embedded capacitance comprising:

a metallic thin film provided for wiring and comprising a metallic material in a non-yield state;

a first electrode formed on the metallic thin film and comprising a titanium layer formed on the metallic thin film, a barrier layer covering the titanium layer and a nickelate compound layer covering the barrier layer;

a dielectric material layer formed on the first electrode and the metallic thin film; and a second electrode formed on the dielectric material layer, wherein the dielectric layer has a coefficient of thermal expansion lower than a coefficient of thermal expansion of the metallic thin film.

19. The thin-film embedded capacitance according to claim 18, wherein the dielectric layer is formed at a temperature not lower than an ordinary room temperature and lower than a yield temperature of the metallic thin film.

* * * * *